United States Patent [19]
Gutman et al.

[11] Patent Number: 5,245,614
[45] Date of Patent: Sep. 14, 1993

[54] VOCABULARY MEMORY ALLOCATION FOR ADAPTIVE DATA COMPRESSION OF FRAME-MULTIPLEXED TRAFFIC

[75] Inventors: Michael Gutman, Haifa, Israel; Michael G. Hluchyj, Wellesley; James A. Pasco-Anderson, Needham, both of Mass.

[73] Assignee: Codex Corporation, Mansfield, Mass.

[21] Appl. No.: 693,170

[22] Filed: Apr. 29, 1991

[51] Int. Cl.⁵ ............... H04B 1/66; H03M 7/36; H03M 7/38
[52] U.S. Cl. ............... 370/118; 375/122; 341/51; 381/32
[58] Field of Search ............... 370/118, 79, 80, 81; 341/51, 65; 358/133, 261.4, 427; 382/56; 375/122; 381/31, 32

[56] References Cited

U.S. PATENT DOCUMENTS

| | | | |
|---|---|---|---|
| 4,420,771 | 12/1983 | Pirsch | 358/133 |
| 4,813,056 | 3/1989 | Fedele | 375/122 |
| 4,847,619 | 7/1989 | Kato et al. | 341/51 |
| 4,899,148 | 2/1990 | Sato et al. | 341/51 |
| 5,136,289 | 8/1992 | Yoshida et al. | 341/51 |
| 5,142,282 | 8/1992 | Tobin et al. | 341/51 |

OTHER PUBLICATIONS

G. Held "Expanding the Uses of Data Compression," Data Communications, pp. 149–156, Jun. 1984.

Primary Examiner—Wellington Chin
Attorney, Agent, or Firm—Darleen J. Stockley

[57] ABSTRACT

A method of and apparatus for allocating memory for storage of vocabularies used in adaptive data compression of a frame-multiplexed data stream of a data communications network. More specifically, a memory of a data compression encoder of the network is partitioned into a plurality of sections for the temporary storage of a corresponding plurality of data compression vocabularies. A memory section of the plurality is assigned to a current frame of the frame-multiplexed data stream based on information of the current frame for storage of a vocabulary created adaptively from the current frame.

34 Claims, 8 Drawing Sheets

VOCABULARY MEMORY ALLOCATION FOR ADAPTIVE DATA COMPRESSION OF FRAME-MULTIPLEXED TRAFFIC

BACKGROUND OF THE INVENTION

The present invention relates to frame-multiplexed data communications networks, in general, and more particularly to a method of and apparatus for allocating memory for the storage of vocabularies used in the adaptive data compression of frame-multiplexed traffic of a data communications network.

Most modern data communications networks include a multiplicity of paths or links which are interconnected to route data traffic from one edge of the network to another. At each edge, there is an interconnect node for coupling a plurality of data sources and data destinations to the network. In some cases, the sources and destinations are first connected to a local area network (LAN) which is then interconnected in the aggregate to the interconnect node. Accordingly, a source of one LAN at one edge of the network may transmit data to a destination of a second LAN located at another edge of the network through their respective interconnect nodes.

Since there generally are a large number of data sources at any given edge which desire to communicate through their respective interconnect node to destinations at various other edges of the network, the data traffic from the various sources is multiplexed through the source interconnect node and then, demultiplexed at the destination interconnect node and delivered to the proper destination point. In most modern systems, data is communicated from a source in a frame unit where each frame unit begins with a frame address ID or header including the source and destination addresses, followed by the data information, and ending with an error correction code, like a CRC code, for example. Accordingly, in these systems, the data traffic from the various sources at the one edge of the network is time-division multiplexed according to the frame units of data. This is commonly referred to as frame-multiplexed data traffic.

The links of the network are rated based on capacity or the rate of data which may be communicated thereover in kilobits per second (kbps), sometimes referred to as link bandwidth. This capacity is fixed for any given link. Some links may have a capacity of 9.6 kbps and others 56 kbps, for example. The user's cost for communicating over the network is based on the link capacity used. That is, it would be much more expensive to use 56 kbps links than the 9.6 kbps links. Therefore, it is the desire of a user to maintain communication over the lower capacity links, even with a higher capacity demand. There are various techniques to achieve an effective capacity of two or three times the fixed capacity of the link thus increasing throughput efficiency of the lower capacity link to accommodate the higher capacity demand. One technique for accomplishing an increased perceived capacity is through use of data compression as described in the paper: G. Held, "Expanding the Uses of Data Compression," Data Communications, pp. 149-156, June 1984".

As explained by the above referenced paper, frame multiplexed traffic is traditionally compressed by either of two methods. The first method encodes the aggregate frame-multiplexed data stream as it flows through the interconnect node like it was a single homogeneous channel, that is all coming from the same source and going to the same destination. The second method which is considered more efficient compresses the data at the terminal port level of each data source before being multiplexed through the interconnect node of the network. The decompression takes place after the demultiplexing at the remote edge of the network.

In general, frame multiplexed data is less compressible in the aggregate than its frame components because of differences in statistical characteristics among the various channels or source/destination pairs. Thus, compressing the frame data separately for each source provides higher compression efficiency. For frame multiplexed traffic, the performance of the first method relies heavily on the frame size. It degrades to unacceptable levels if frames are too short. On the other hand, the second method performs independently of the multiplexing schemes, but depends on accessibility to the data before multiplexing, i.e. at the terminal port level of the node for each source.

Data compression encoding is usually accomplished by some adaptive method in which the encoder adapts to the statistics of the aggregate data as it passes through the encoder. In so doing, the encoder gathers statistics, referred to as the data compression vocabulary which it stores in a dedicated volatile memory space. Both the encoder and decoder continuously update their vocabularies based on the current data being communicated. In the aggregate data compression method, only one vocabulary is presently being used and updated at both the encoder and decoder of the source and destination interconnect nodes, respectively. However, in the second method of data compression, a separate vocabulary is kept for each terminal port of a data source.

The use of a single vocabulary shared among the various terminal ports of an interconnect node and adapted according to the data being communicated therethrough appears rather attractive. However, in most data compression encoders, the data compression vocabulary adapts itself to specific sequence of characters, numbers, symbols, probabilities, or the like of a frame which is currently being encoded. Accordingly, the data compression efficiency of a single shared vocabulary is based on the type of data being multiplexed from the sources of an interconnect node. If all of the sources are transmitting the same type of data, e.g. all text or all numbers, then the single shared vocabulary will adapt itself to provide a rather good compression efficiency ratio. On the other hand, if there are different types of data being frame-multiplexed through the encoder, then the overhead operations associated with the adaptive compression processing may cause the efficiency ratio to be less than one, that is actually worse than if the data was passed uncompressed, in some cases. Accordingly, in such systems one could expect a very poor compression ratio overall.

Since most networks include data sources transmitting a wide variety of data through each interconnect node, it is believed of paramount importance to include a plurality of vocabularies to maintain an acceptable data compression efficiency. If each interconnect node of the network had an unlimited memory resource, then a different portion of the memory could be allocated for each possible vocabulary. But, since memory is a limited resource at each node, this is not a practical solution. Accordingly, it is the intent of the present invention to provide for the various vocabularies needed to satisfy all of the source/destination communications of each interconnect node at an acceptable data compression efficiency with the limited available memory thereof.

SUMMARY OF THE INVENTION

In accordance with one aspect of the present invention, a method of allocating memory for storage of vocabularies used in adaptive data compression of a frame-multiplexed data stream of a data communications network comprises the steps of: partitioning a memory of a data compression encoder into a plurality of sections for the temporary storage of a corresponding plurality of data compression vocabularies; and assigning a memory section of the plurality based on information of a current frame of the frame-multiplexed data stream for storage of a vocabulary created adaptively from the current frame. In one embodiment, the memory section is assigned dynamically. In another embodiment, a memory section of the plurality is assigned to the current frame based on the address information in the current frame. Preferably, the frame address information includes a source/destination pair of addresses.

In another aspect of the present invention, apparatus for allocating memory of a data compression encoder comprises memory means partitioned into a plurality of sections for the temporary storage of a corresponding plurality of data compression vocabularies; and means for assigning a memory section of the memory means based on information of a current frame of the frame-multiplexed data stream to store a vocabulary created adaptively from the current frame by the encoder. In one embodiment, the assigning means includes means for assigning a memory section dynamically. In another embodiment, the assignment is based on the address information in the current frame, preferably source/destination addresses.

DESCRIPTION OF THE PREFERRED EMBODIMENT

Figure 1:
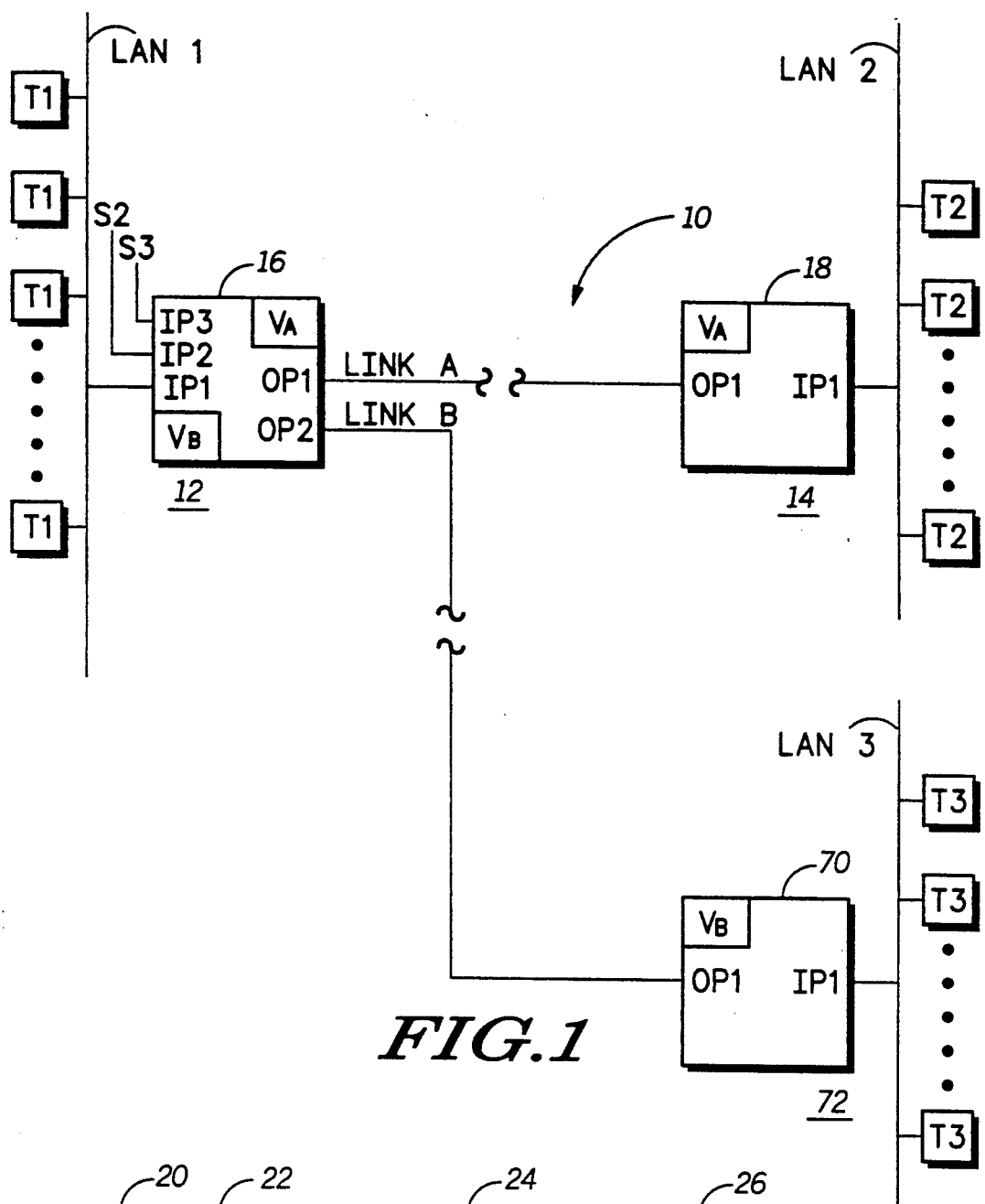
FIG. 1 is a block diagram schematic of a data communications network suitable for embodying the principles of the present invention.

FIG. 1 depicts a block diagram schematic of a data communications network 10 suitable for embodying the principles of the present invention. Referring to FIG. 1, at outer edges 12 and 14 of the network 10 there is included respective interconnecting nodes 16 and 18 which are interconnected over a physical connection depicted as link A in the present embodiment. It is understood that link A may represent in one case a point-to-point direct connection, and in other cases a plurality of communication paths of the network selectively interconnected to route data traffic between its respective nodes 16 and 18. Link A is coupled to the nodes 16 and 18 through respective output ports OP1 thereof.

For the purposes of describing the instant embodiment, it is assumed that the interconnecting node 16 is a source node and the interconnecting node 18 is a destination node. Accordingly, various sources may be coupled to the interconnecting node 16 through its input ports IP1, IP2, IP3, ... In the present example, one data source at the edge 12 is a local area network LAN1 depicted as having a plurality of terminals T1 which are coupled to each other and to the input port IP1. Other data sources S2 and S3 may be coupled to the input ports IP2 and IP3, respectively. Similarly, at the edge 14 another plurality of terminals T2 may be interconnected to each other and to a input port IP1 of node 18 over another local area network LAN2.

Figure 2:
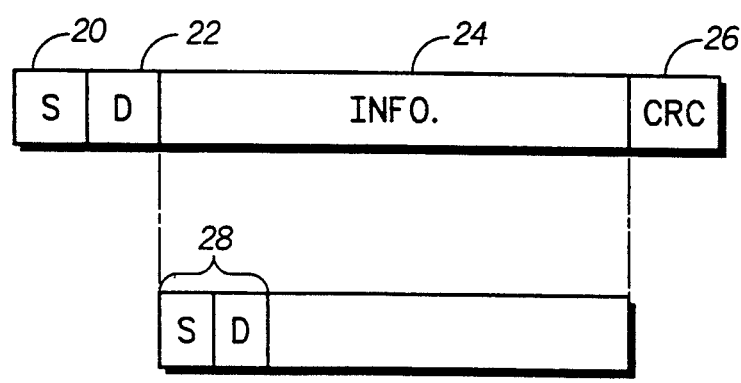
FIG. 2 is an illustration of an exemplary format of a frame of information by which data may be delivered from a source to a destination of the network of FIG. 1.

A unit of information by which data is delivered from a source terminal T1 through the network 10 to a destination terminal T2 may be a frame having a format similar to that illustrated in FIG. 2. Referring to FIG. 2, typically, a frame of data has address information in a header including a source address 20 followed by a destination address 22, both of which may be on the order of 48 bits. The header is followed by a data information portion 24 which may include anywhere from a few bytes to several thousand bytes of data. The frame may end with an error correction code 26 which may be of the cyclic redundancy check (CRC) type of 16 or 32 bits, for example. In the present example, the source address 20 may represent one of the terminals T1 of LAN1 or one of the sources S2 or S3. Similarly, the destination address 22 may represent, for the present example, one of the terminals T2 of the LAN2.

Figure 5:
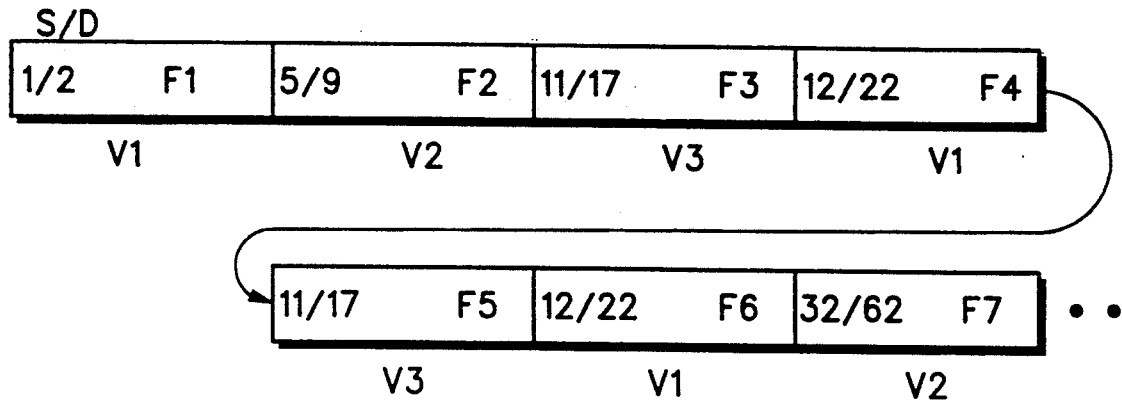
FIGS. 5 and 6 are illustrations of frame multiplexed data suitable for use in explaining a least recently active technique of dynamic memory allocation.

To improve efficiency and/or throughput of the network 10, data traffic is time multiplexed from the various sources on a frame basis which is commonly referred to as frame multiplexing. An illustration of frame multiplexing is shown in FIG. 5 which will be described in more detail herein below. More specifically, the data frames from the various sources are time multiplexed in the interconnecting node 16 in a conventional manner and output in the aggregate over Link A to the interconnecting node 18 wherein the aggregate frame multiplexed data stream is demultiplexed to the various destination units T2 of the LAN2. In the simple point-to-point case, the interconnecting nodes 16 and 18 may be simple two-port bridges with conventional modems for transmission. In more complex cases, the interconnecting nodes may include either a multiport bridge or a multiport router interconnected by high-speed digital facilities, for example.

For the case in which the interconnecting nodes include a bridge, the bridge at node 16 first monitors in a "promiscuous" mode the data traffic occurring over the LAN1 keeping track of the source addresses thereof in a local source address table created in its memory. After creating the local source address memory table, the bridge may then monitor the destination addresses of each frame of the data stream to determine whether or not the data frame is destined for the local LAN or for delivery to another edge of the network 10. If the destination address is one of the addresses in the local source address table, the bridge does nothing with the data frame. On the other hand, if the destination address is not recognized as a local source address, the bridge takes the data frame into the node 16 and conditions it for delivery across the network to the node 18 at the other edge 14, for example. The bridge of the node 16 may buffer data frames from the various sources coupled thereto to transmit all data in the aggregate as a frame multiplexed data stream over Link A to the interconnecting node 18.

The router is a more straight forward device, because rather than going through the foregoing described learning process in connection with the source addresses of the local LAN1, it is provided with apriori information to accept a data frame and then look at a second source/destination address pair which may be found in the information portion 24 of the frame such as shown at 28 in the illustration of FIG. 2. The additional source/destination address pair at this second level reveals to the router that the data frame is not destined for the local LAN, but rather is destined to be linked to another edge 14 of the network 10. The second level destination address dictates to the router the destination node in accordance with some predetermined routing table thereof. However, the router may still determine at its option the best combination of paths in forming Link A. It is understood that bridges and routers are well known devices within the general category of LAN interconnecting nodes of a network and operate in a conventional manner which is well known to all those skilled in the pertinent art.

As has been indicated in the background section supra, it is the intent of the present invention to accommodate higher data traffic demands with links of smaller capacity to economize. In the present embodiment, data compression techniques are used to yield an effective capacity of on the order of two or three times that limited by the fixed capacity of the chosen link. A suitable data compression technique oriented towards modems is specified by the CCITT standard V.42 bis. Another data compression technique which may be suitable for the more complex multiport cases is described in greater detail in the patent application bearing Ser. No. 07/299,759 entitled "Variable Length String Matcher", assigned to the same assignee as the present application (VLSM).

In connection with the data compression of the aggregate frame multiplexed data stream delivered from node 16 over Link A to node 18, there is data compression apparatus and corresponding limited resource memory, denoted as $V_A$, disposed in each of the nodes 16 and 18 for storage of the associated data compression vocabularies used in the encoding and decoding data compression operations. In accordance with one aspect of the present invention, memory space of $V_A$ is allocated to accommodate the source/destination data traffic between the interconnecting nodes 16 and 18 at an acceptable data compression efficiency. A suitable embodiment of this aspect of the present invention is shown by the block diagram schematic of FIG. 3.

Figure 3:
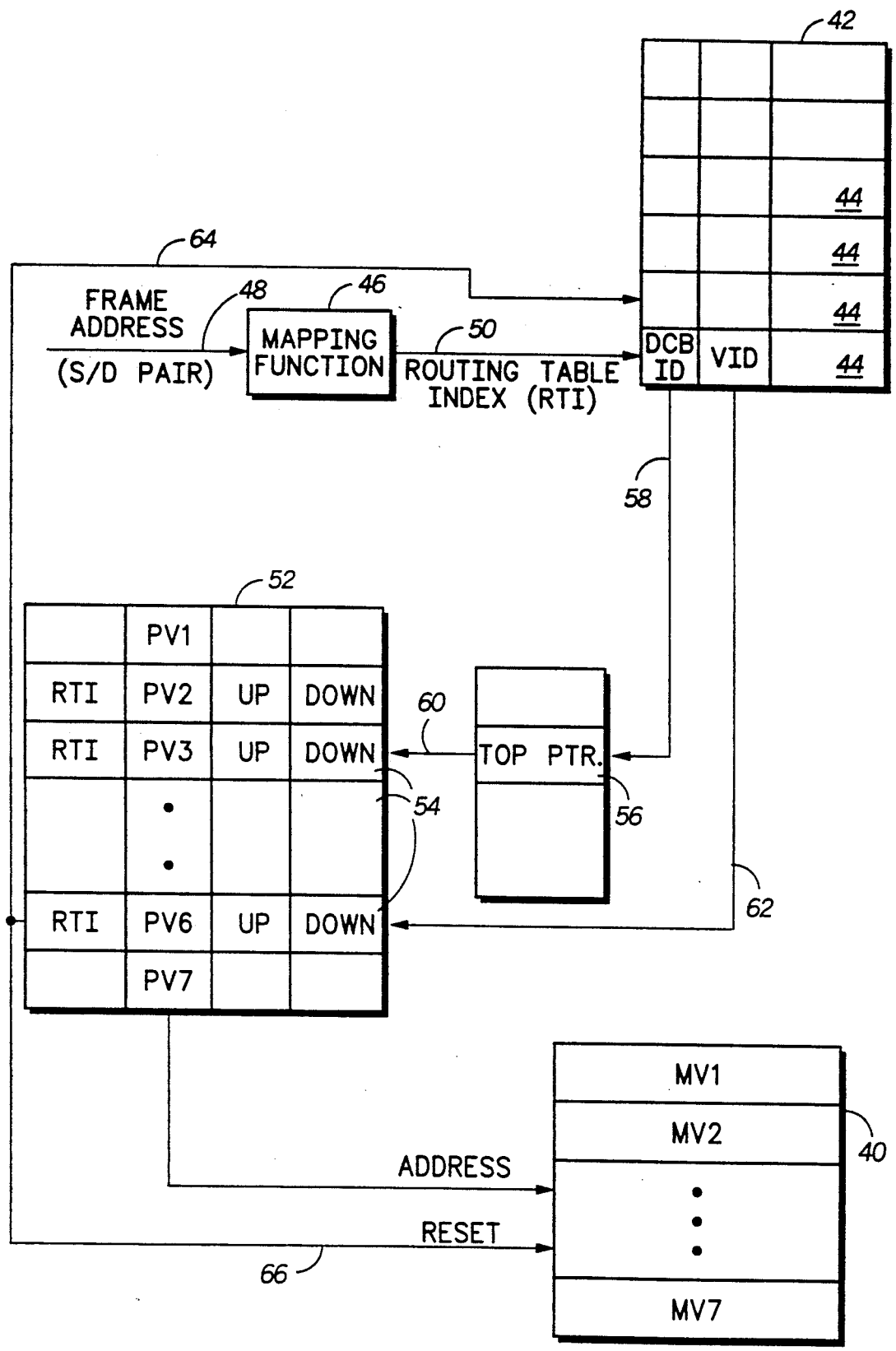
FIG. 3 is a block diagram schematic illustrating one aspect of the present invention in which memory space is allocated to accommodate source/destination data traffic between interconnecting nodes of the network at an acceptable data compression efficiency.

Referring to FIG. 3, the memory $V_A$ of the data compression encoder of the node 16 may be partitioned into a plurality of memory sections MV1, MV2, ... MV7 as shown at 40 for the temporary storage of a corresponding plurality of data compression vocabularies. A memory section MV of memory 40 is assigned for storage of a vocabulary created adaptively from a current frame based on information of the current frame of the frame-multiplexed data stream being compressed in the node 16. In the present embodiment, the source/destination pair of addresses (i.e. address information) of the current frame is used as a basis for memory section assignment as will be described in greater detail herein below.

The data compression encoder may further include an area of memory 42 characterized as a routing table, which includes a plurality of memory slots 44 for storing an indication of memory section vocabulary assignments. In the present embodiment a plurality of the possible source/destination address pairs are assigned a Routing Table Index (RTI) code for addressing table 42. A mapping function 46 monitors the source/destination address pair of a current frame input thereto over the signal line 48 and maps the current address pair using any well known mapping technique into its assigned RTI code. The memory slots 44 of the memory area 42 have addresses which are correlated directly with the assigned RTI codes corresponding to the plurality of source/destination address pairs. Therefore, the resulting RTI code from the mapping function 46 is provided over signal line 50 to access the contents of its corresponding memory slot 44.

Figure 7:
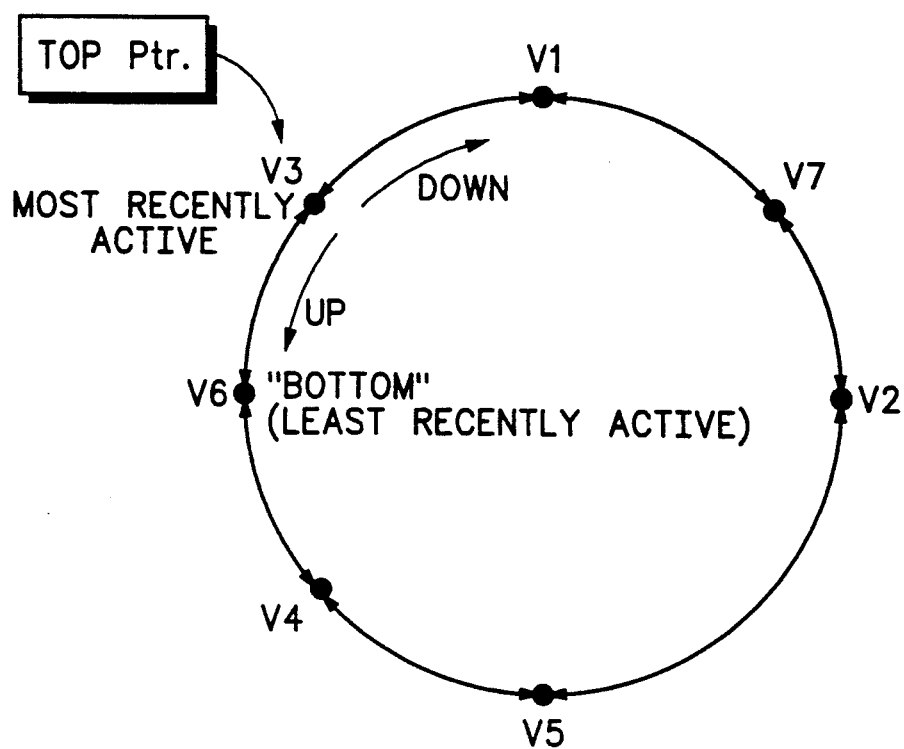
FIGS. 7 and 8 are illustrations of a circular arrangement of various vocabularies used in connection with the least recently active memory allocation technique.

In the present embodiment, the addressing scheme of the various vocabularies V1-V7 corresponding to the memory sections 40 are assigned in a circular arrangement as shown by the illustration of FIG. 7 with one of the vocabularies designated as the top priority vocabulary. In the example of FIG. 7, vocabulary V3 is considered top priority. In order to keep track of the circular arrangement of the various vocabularies V1-V7, another area 52 of memory includes corresponding memory slots 54 for the storage of address pointers for establishing the circular arrangement illustrated in FIG. 7. (Although we refer in this embodiment to memory accesses via pointers, one may instead chose to use offsets into a table to achieve an equivalent functionality.) For example, the memory slot 54 corresponding to one vocabulary say V3, for example, may include the address (DOWN) which is the address of another memory slot of the memory 52 corresponding to the adjacent vocabulary V1 in the down circular direction, and the address (UP) which is the address of yet another slot 54 of the memory 52 which corresponds to the vocabulary V6 adjacent to V3 in the up circular direction. In addition, each memory slot 54 corresponding to the vocabularies V1-V7 includes respectively a pointer address PV1-PV7 for addressing the various memory sections MV1-MV7 of memory 40. In addition, the memory slot 54 includes the RTI code currently assigned to the corresponding vocabulary of the slot. The address of the memory slot 54 corresponding to the vocabulary which is considered top priority is stored in a register 56.

According to the present aspect of the invention, the frame multiplexed data stream is being conducted solely between the nodes 16 and 18 over Link A. Accordingly, all of the source/destination addresses and corresponding routing table indices are bundled for the link between the nodes 16 and 18. This bundling of data traffic is given a data compression bundle ID (DSB-ID) which is stored in each of the memory slots 44 that have indices within the bundle. In addition, if an RTI code has been previously assigned a vocabulary it will have a vocabulary ID (VID), stored in its corresponding memory slot 44. This VID is the address of the corresponding memory slot 54 of memory area 52. If an RTI code has been unassigned, then the VID associated therewith in memory slot 44 is nulled.

Thus, during the initial stages of memory allocation, some of the memory slots 54 may be unassigned. When the RTI code of a current frame reveals a nulled VID in the corresponding memory slot 44, the accessed DCB-ID of the slot addresses the register 56 over signal line 58 to obtain the address of the memory slot 54 corresponding to the top priority vocabulary. The top priority vocabulary memory slot 54 is accessed over signal line 60 to obtain the address UP to access the memory slot of the vocabulary considered at the bottom of the vocabulary stack which becomes the assigned vocabulary of the current frame. Of course, if a vocabulary address has been assigned to the current RTI code, then the VID of slot 44 associated therewith may be used to address the corresponding memory slot 54 directly over signal line 62.

When the memory slot 54 is accessed in accordance with the index of the current frame, the obtained pointer PV stored therein is used to address the corresponding memory section of memory 40 for storage of the vocabulary created from the contents of the current frame. In addition, the RTI code is stored in the accessed memory slot 54 and used to readdress the memory slot 44 over signal line 64. If the address of the memory slot 54 had not been previously assigned to the current RTI code then the address is stored in the VID content thereof for subsequent retrieval and the address of the memory slot 54 most recently active is stored in the register 56.

When all of the unassigned memory sections MV1-MV7 of memory 40 have been assigned to corresponding routing table indices, then an assigned memory section is designated for reassignment when the RTI code of a current frame is different from those corresponding to the currently assigned memory sections. There are a variety of techniques for designating an assigned memory section for reassignment. Among the various techniques are the least recently active and sequential selection to name just a few. The designation technique chosen for the present embodiment is the least recently active. That is, arranging the assigned vocabularies in an order such as that shown by the illustration of FIG. 7 such that the UP address of the most recently active vocabulary, which is shown as V3, points to the bottom or least recently active vocabulary shown as V6 and so on. Accordingly, the top priority address in register 56 always points to the top of the vocabulary list and the UP address contained in the memory slot of Table 52 corresponding to the top priority vocabulary always points to the bottom of the list or least recently active which when reassigned then becomes the top of the list. In the present embodiment, before each memory section reassignment, the contents of the memory section of the memory 40 are reset by the reset line 66.

Figure 6:
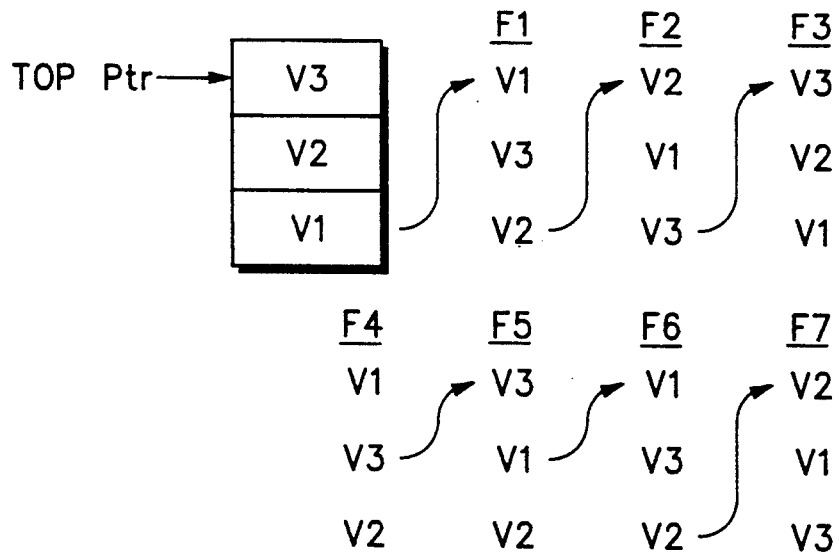

A simple explanation of the least recently active designation technique which is considered a dynamic allocation is provided here in accordance with the illustrations of FIGS. 5 and 6. FIG. 5 illustrates a frame multiplex data stream including a series of frames designated F1–F7. Each data frame commences with a source/destination (S/D) address pair as exemplified by the "1/" for frame F1, "5/9" for the frame F2, and so on. FIG. 6 illustrates the stacking of the vocabularies for the current frame.

To start with, it is assumed that the contents of memory 40 have been reset and the vocabularies are stacked with V3 being the top priority and V1 at the bottom or least recently active of the stack. As frame F1 becomes the current frame, the memory section MV1 is assigned thereto in accordance with the S/D address pair thereof. Accordingly, vocabulary V1 goes to the top of the stack and vocabulary V2 is rendered the least recently active vocabulary. As frame F2 becomes the current frame, the memory section MV2 is assigned thereto in accordance with the S/D address pair thereof. Vocabulary V2 is placed at the top of the stack and vocabulary V3 falls to the bottom. Because of its least recently active status, the memory section MV3 is assigned to the S/D address pair of the current frame F3 and as a result, the vocabulary V3 becomes the most recently active once again. After the current frame F3 all of the vocabularies V1-V3 in the present example, have been assigned to respective indices.

Figure 8:
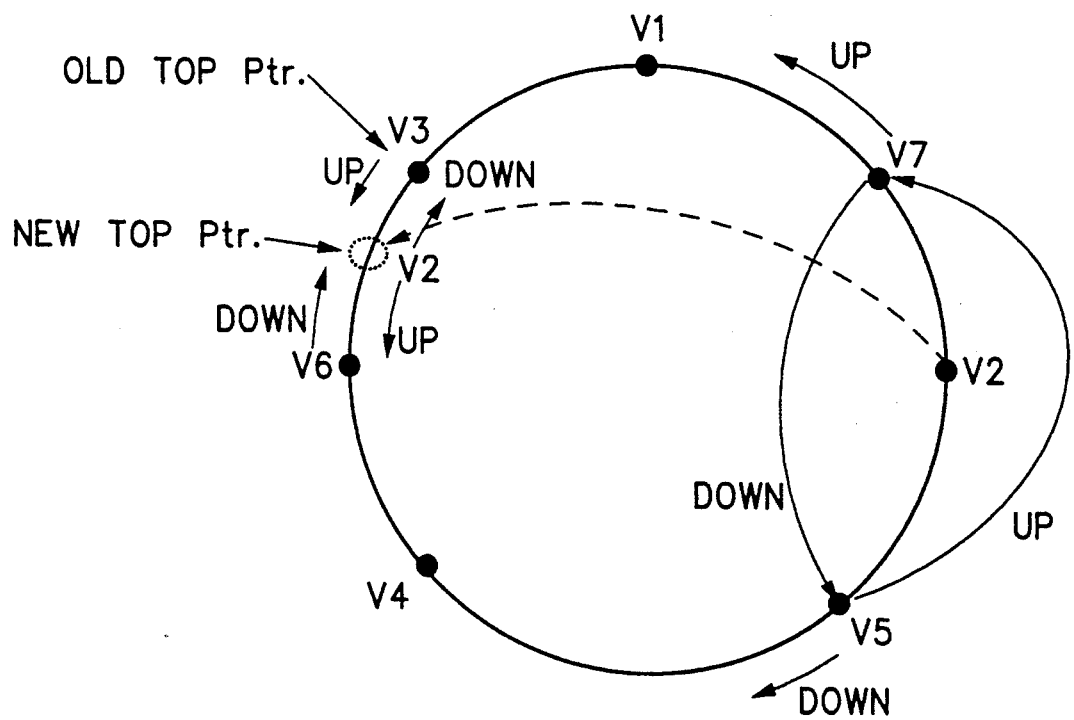

The next current frame F4 includes a RTI code which does not correspond to the indices of the assigned memory sections. Accordingly, the memory section MV1 of the least recently active vocabulary V1 is assigned to the frame F4. But before storage of the vocabulary created from the current frame V4 the contents of the memory section MV1 is reset. The next current frame F5 includes a RTI code corresponding to the assigned memory section MV3. Note that in this case the vocabulary V3 is not taken from the bottom and placed at the top of the stack, but rather must be taken from the middle of the stack. Thus, rearrangement of the stack cannot simply be altered by changing the address of the top priority register 56, but must additionally include altering the UP and DOWN addresses of various adjacent vocabulary slots 54 as illustrated in FIG. 8. A more detailed description of this rearrangement is provided in the following paragraphs. Note also, that no reset of the contents of the memory section MV3 is performed, but rather the vocabulary V3 continues to be adapted in accordance with the data of the current frame F5 using conventional data compression techniques. Continuing, the RTI code of the next current frame F6 has been assigned the memory section MV1 corresponding to the vocabulary V1 which is similarly taken from the middle of the stack and placed at the top. No reset occurs in connection with the adaptation of vocabulary V1 in accordance with the data of frame F6. The RTI code of the next frame F7 is not a member of the assigned indices for the memory sections of the memory area 40. Therefore, the least recently active vocabulary V2 is chosen and the memory section MV2 is reset for storage of the newly created vocabulary in accordance with the data of frame F7. Vocabulary V2 is repositioned to the top of the stack. Accordingly, based on the simple foregoing described examples, an appreciation is gained on how the least recently active technique is used for designating assigned memory sections for the reassignment using the indices of the current frames.

In accordance with another aspect of the present invention, your reference is directed back to the block diagram schematic of FIG. 1 to point out that some data communication networks include include a multiport source interconnecting node as that shown by node 16 which may communicate concurrently with a plurality of destination interconnecting nodes. It has already been described hereabove how the interconnecting node 16 is coupled to and communicates with the node 18 at the other edge 14 of the network 10. In this aspect of the present invention, the node 16 may also be coupled to another interconnecting node 70 at another edge 72 of the network across a communications path(s), denoted as link B. In the present embodiment, link B may be coupled to a second output port OP2 of node 16 and to an output port OP1 of node 70.

Still further, another local area network LAN3 may be used for interconnecting a plurality of destination terminals T3 among themselves and to an input port IP1 of the node 70. Accordingly, a source terminal T1 of LAN1 may communicate over link B via nodes 16 and 70 in a data compressed frame multiplexed data stream with a destination terminal T3 of LAN 3. For this purpose, limited memory resources, denoted as $V_B$, are included in the nodes 16 and 70 for storage of the associated vocabularies assigned to the bundle of source/destination address pairs communicating between the nodes 16 and 70. The limited memory resource $V_B$ may be allocated to the vocabularies to support the various source/destination communications over link B at an acceptable data compression efficiency. The memory allocation for this purpose may be accomplished in a similar manner as that described in connection with the embodiment of FIG. 3 except that it is understood that the extended embodiment of FIG. 1 now includes another data compression bundle of data channels communicated over link B between the nodes 16 and 70. Accordingly, accommodation should be made in the encoder apparatus of node 16 for a plurality of data compression bundles of communication channels and an embodiment suited for this purpose is shown by the block diagram schematic of FIG. 4.

Figure 4:
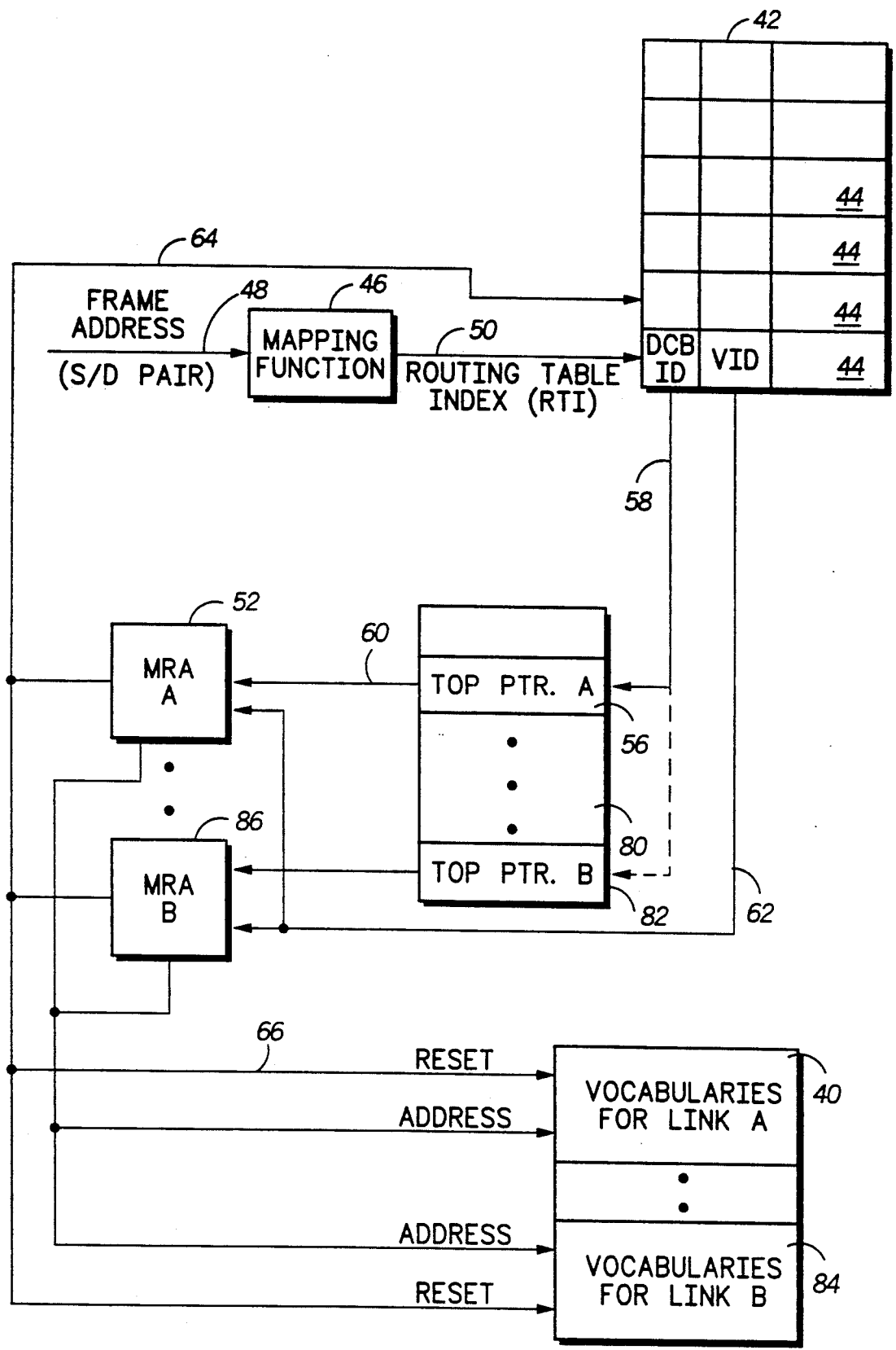
FIG. 4 is a block diagram schematic illustrating another aspect of the present invention in which the memory allocation accommodates a plurality of data compression bundles of communication channels.

Referring to FIG. 4, the functional blocks which remain the same or similar to those described in connection with the embodiment of FIG. 3 are numbered the same as that of FIG. 3. Since in the instant embodiment the indices associated with the data channels may be included in different bundles, then a separate ID is assigned to each of said bundles. For example, in FIG. 1, a DCB-ID is assigned to the link-up between the nodes 16 and 18 referred to as link A, and a separate DCB-ID is assigned to the link-up between the nodes 16 and 70 referred to as link B. Accordingly, a memory area 80 is partitioned into a plurality of data registers including the data register 56 for retaining the address of the top priority vocabulary of each bundle. That is, register 56 contains the top priority address of bundle A and register 82 contains the address of the top priority vocabulary for bundle B and so on.

Furthermore, in accordance with the present embodiment, the vocabulary memory 40 is further partitioned into portions for storage of the various vocabularies and sections thereof for the corresponding data compression bundles. The vocabulary memory portion 40 for bundle A has already been described in connection with the embodiment of FIG. 3. Another portion 84 may be partitioned from the vocabulary memory for sectionalizing and storage of the vocabularies of the frames communicated over the bundle B. It is clear that the vocabulary memory may be further partitioned into other portions to accommodate vocabularies of other data compression bundles C, D and so on. Finally, another most recently active (MRA) memory table 86 is added for storage of the UP and DOWN address pointers associated with the least recently active stacking technique, the address pointers for the vocabulary portion 84 and the routing table indices (RTI's) corresponding to the bundle B.

Thus, in the embodiment of FIG. 4, the register 56, 82 ... containing the address of the top priority vocabulary is designated by the DCB-ID of the RTI code of the current frame for addressing the corresponding memory table 52, 86, . . . , respectively. Once the proper bundle memory portion is designated from the RTI code of the current frame the remaining operations associated with dynamic vocabulary memory allocation are consistent with that described in connection with the embodiment of FIG. 3.

Figure 9A:
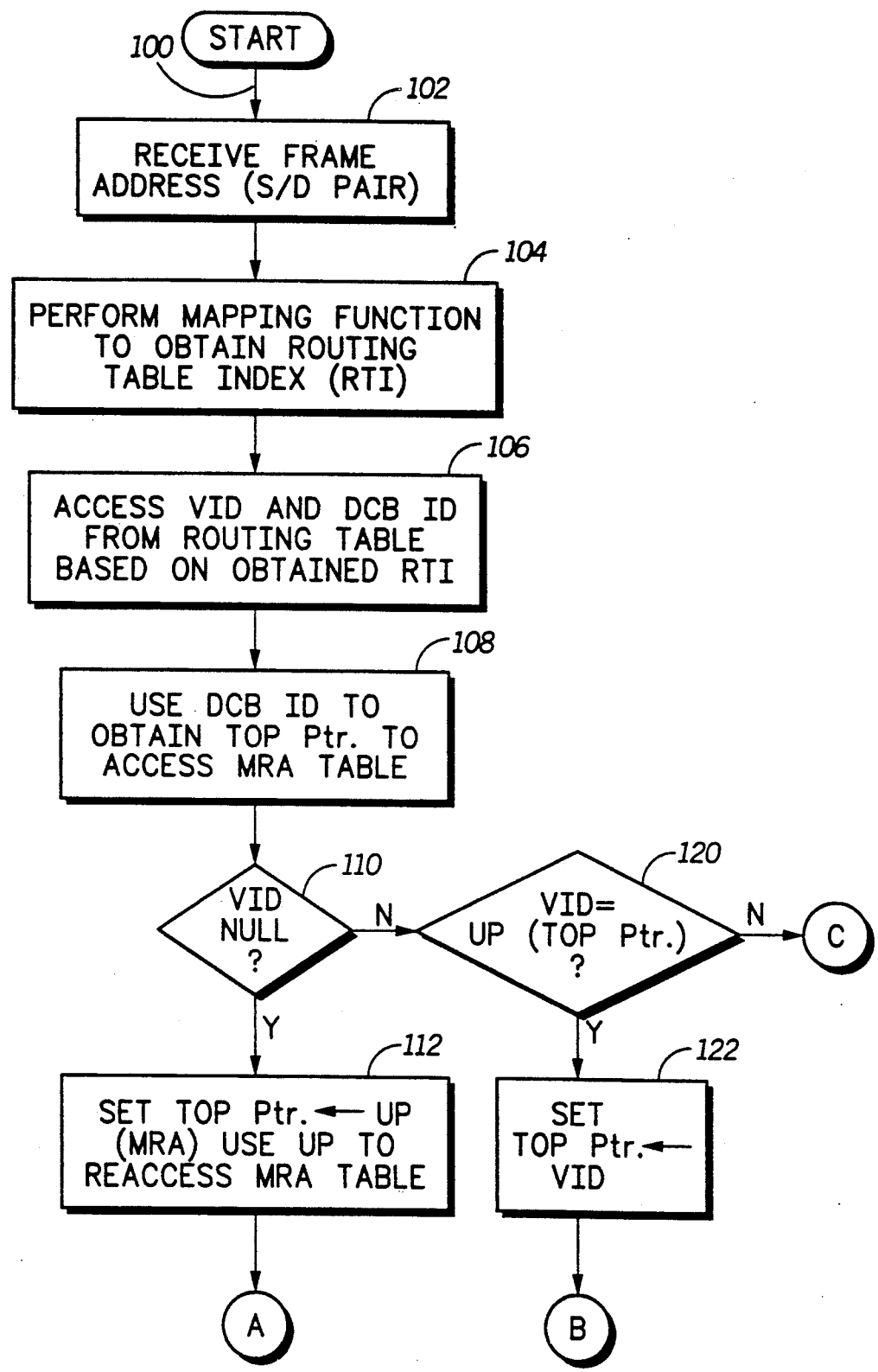
FIGS. 9A, 9B and 9C are flowcharts of exemplary dynamic vocabulary memory allocation operations suitable for use in the embodiments described in connection with FIGS. 3 and 4.
Figure 9B:
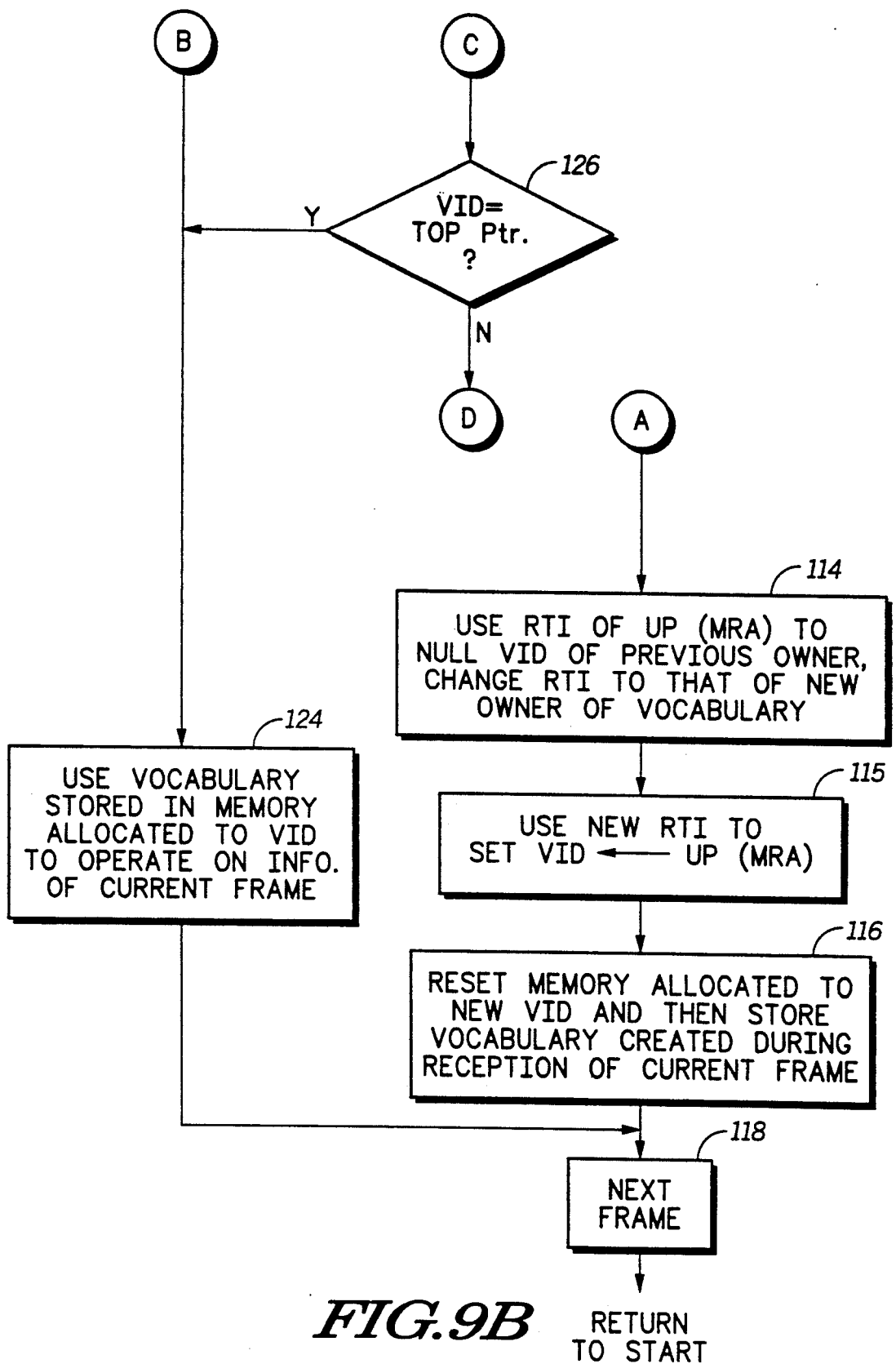
Figure 9C:
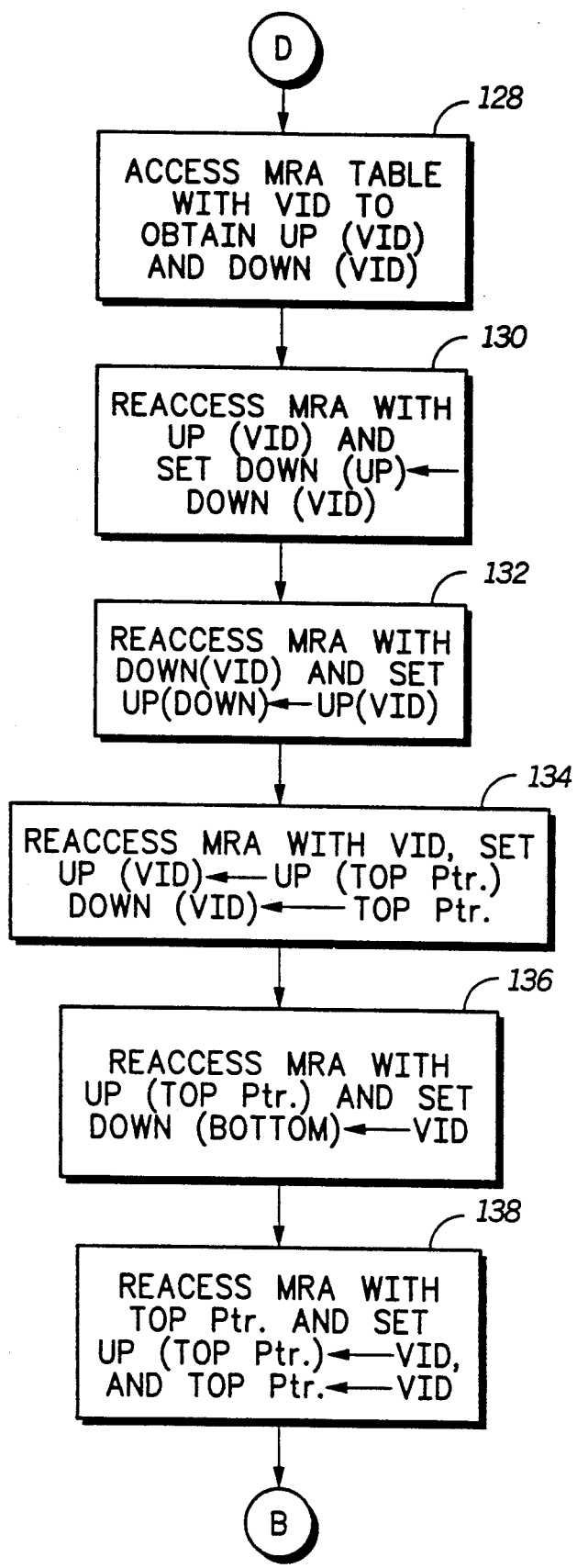

For a better understanding of the embodiments described in connection with the block diagram schematics of FIGS. 3 and 4, the flow charts of FIGS. 9A, 9B and 9C are provided. The dynamic vocabulary memory allocation operations commence at 100 for each current frame address in the frame-multiplexed data stream being encoded for data compression in the source node 16. As has been described hereabove, the address information of each current frame which is preferred for vocabulary memory allocation is that of the source/destination (S/D) address pair which is received in block 102. A mapping function may be performed on the received address pair in block 104 to obtain the unique RTI code associated therewith. Next, in block 106, the memory slot 44 of the table 42 corresponding to the RTI is addressed to obtain the VID and DCB-ID stored therein. Thereafter, in block 108, the bundle ID is used to obtain a top priority address from memory 80 to access the proper MRA storage table. If there is only one data compression bundle then the register 56 will be accessed. Otherwise, any one of the registers in the group of register 80 may be accessed by the bundle ID.

Next, in decisional block 110, it is determined if the accessed VID code is a null code. If the determination of block 110 is positive, then, in block 112, the top priority address obtained from memory 80 is used to access its corresponding slot 54 in the MRA memory table. From the accessed memory slot, the UP address is obtained and stored in the top priority register 56. The UP address is also used to reaccess its corresponding memory slot 54 of the MRA Table. The flowchart then continues at block 114 in FIG. 9B.

A null VID, as determined in decisional block 110, is an indication that no vocabulary is assigned to the current frame as represented by the RTI thereof. The UP address obtained in block 112 represents a vocabulary at the bottom of the stack (see FIG. 7) or the least recently active vocabulary. This designated vocabulary then becomes the most recently active by storing the obtained UP address thereof in the top priority register 56. The UP address is also used to access the slot 54 corresponding to the designated vocabulary. Note that the RTI residing in the accessed memory slot 54 is that of the prior owner of the vocabulary. In block 114, the residing RTI is used to access its memory slot of the routing Table 42 to null the VID code thereof so that the prior vocabulary owner will no longer be assigned a memory slot or associated vocabulary. Thereafter, still in block 114, the residing RTI of the designated memory slot 54 is changed to the RTI of the current frame representative of the new owner of the corresponding vocabulary. In the next block 115, the RTI of the new owner is used to access its corresponding memory slot 44 of the routing table memory 42 to set the VID code thereof to the address of its designated memory slot 54 of the MRA Table 52. Then in block 116, the memory MV of the vocabulary memory 40 allocated to the new VID is reset first, and then used to store therein the vocabulary created during the reception of the current frame. The flow processing continues in block 118 to accept the next current frame in the sequence, then returned to the start of the processing in FIG. 9A.

Returning to block 110 of FIG. 9A, if the VID code is not null, then it is determined, in the decisional block 120, if the VID correlates with the address of the vocabulary at the bottom of the stack. This may be accomplished by obtaining the UP address of the memory slot 54 accessed by the address of the top priority vocabulary and comparing it to the current VID. Should the determination of block 120 be positive, then the VID is stored in the top priority register of its corresponding bundle, in block 122, and the flowchart continues at block 124 in FIG. 9B. In block 124, the current VID is used to address the corresponding memory slot 54 of the MRA Table 52 to obtain the pointer address PV which addresses the vocabulary memory section allocated to the current VID. Accordingly, the vocabulary stored therein is used to operate on the information of the current frame and to be further adapted based on the data thereof. The flowchart processing continues thereafter with the next current frame in block 118.

Referring back to FIG. 9A, if the determination of block 120 is negative, then the flowchart processing continues at the decisional block 126 in FIG. 9B wherein it is determined if the VID of the current frame is already assigned the most recently active vocabulary. If the determination of block 126 is positive, the flowchart processing continues at block 124; otherwise, processing continues at block 128 of FIG. 9C.

Negative decisions of blocks 110, 120 and 126 leads to the determination that a memory section has been assigned to the S/D address pair (or RTI) of the current frame, but that vocabulary is in the middle of the stack and must now be rearranged to the top of the stack as depicted in the illustration of FIG. 8 using vocabulary V2 as an example. The flowchart blocks of FIG. 9C exemplify the processing operations which take place in the present embodiment to accomplish the operation illustrated in FIG. 8.

Referring to block 128 of FIG. 9C, the memory slot 54 of the MRA Table 52 corresponding to the current VID is accessed to obtain the UP and DOWN addresses thereof which shall be hereafter referred to as UP (VID) and DOWN (VID). In the next block 130, the UP (VID) is used to reaccess its corresponding memory slot of the MRA Table 52 to obtain the DOWN address thereof, which shall be referred to as DOWN (UP). Then, DOWN (UP) is set to the address DOWN (VID). Thereafter, in block 132, the address DOWN (VID) is used to access its corresponding memory slot of MRA 52 and the UP address thereof, which is referred to as UP (DOWN), is set to the address UP (VID).

We may relate the processing of the blocks 128, 130 and 132 to the illustration of FIG. 8. For example, VID may correspond to the address of the memory slot of vocabulary V2, the UP (VID) corresponds to the address of V7 and DOWN (VID) corresponds to the address of vocabulary V5, all of the table corresponding to the assigned bundle. In taking a vocabulary from the middle of the stack, the UP and DOWN addresses of the adjacent vocabularies, i.e. V5 and V7, must be rearranged so they relate to their resulting positions in the stack, that is the UP address of the memory slot corresponding to V5 must point to the slot of V7 and the DOWN address of the memory slot corresponding to V7 must point to the slot of V5. Thereafter, the vocabulary V2 is positioned to the top of the stack between the previous top priority vocabulary and bottom vocabulary, V3 and V6, respectively, for example. In so doing, the UP and DOWN addresses of the vocabularies V2, V3 and V6 must all be rearranged. This is accomplished in the flowchart blocks 134, 136 and 138 of FIG. 9C.

In operational block 134, the address UP (VID) is set to the UP address of the previous top priority vocabulary, V3, and the address DOWN (VID) is set to the address of the previous top priority vocabulary, V3. Thereafter, in block 136, the UP address of the previous top priority memory slot is used to reaccess the corresponding memory slot of the MRA Table 52 and the DOWN address thereof is set to VID. Finally, in block 138, the MRA Table 52 is reaccessed with the address of the previous top priority vocabulary and the UP address thereof is set to VID. In addition, the top priority register of the corresponding bundle is set to VID and the flowchart processing is continued at the block 124 in FIG. 9B.

The foregoing description used the least recently active technique for designating an assigned memory section for reassignment in accordance with information of the current frame, however it is understood that with slight modification, a sequential selection technique may also be used for such designation as will be explained briefly here below.

With the sequential selection technique, the up and down pointers in table 52 may be eliminated, and register 56 used to select successive entries in table 52 for resetting and reassigning a vocabulary in 40 to an arriving frame whose VID in routing table memory 42 is null. Register 56 may be updated with a modulo counter that steps through each successive entry of Table 52 (wrapping from the bottom back to the top of the table) whenever an arriving frame requires the resetting/reassignment of a vocabulary. All other operations remain as with the least recently active technique. Note that the up/down pointer manipulations of table 52 associated with the least recently active technique are avoided with the sequential selection technique.

For either the least recently active or sequential selection techniques, the processing at the destination nodes 18 and 70 is straightforward. Each received frame may carry with it information of its corresponding DCB-ID and VID and whether or not the associated vocabulary allocated in $V_A$ and $V_B$ should be reset before used in decompressing the frame. Access to the proper vocabulary at the destination node is then direct, with one only needing a mapping for each DCB-ID/VID pair to the associated vocabulary memory section. This mapping is fixed at the time the data compression bundle is configured in the network. Only the source node 16 has to deal with the reassignment of vocabularies and the mappings from source/destination address pairs to the DCB-IDs and VIDs.

While various aspects of the present invention have been described in connection with the above presented embodiments, it is understood that additions, deletions and modifications thereof may be accomplished without deviating from the principles of the present inven-

We claim:

1. A method for allocating memory for storage of vocabularies used in an adaptive data compression of a frame-multiplexed data stream of a data communications network, said method comprising the steps of:
   partitioning a memory of a data compression encoder into a plurality of sections for the temporary storage of a corresponding plurality of data compression vocabularies; and
   assigning a memory section of said plurality based on information of a current frame (other than information from a user data-information field) of said frame-multiplexed data stream for storage of a vocabulary created adaptively from said current frame for the duration of the frame.

2. The method in accordance with claim 1 wherein the memory section for storage of a vocabulary is assigned dynamically.

3. The method in accordance with claim 1 including the steps of:
   including in each frame of the frame-multiplexed data stream address information; and
   assigning a memory section of said plurality to the current frame based on address information in the current frame.

4. The method in accordance with claim 3 wherein the memory section is assigned based on frame address information including a source/destination pair of addresses.

5. The method in accordance with claim 3 wherein the steps of assigning includes the steps of:
   assigning an unassigned memory section of said plurality to each current frame having frame address information different from that corresponding to the assigned memory sections until all of the memory sections are assigned; and
   thereafter, reassigning a designated assigned memory section of said plurality for storage of a vocabulary for a current frame having frame address information different from that corresponding to the assigned memory sections.

6. The method in accordance with claim 5 wherein the reassignment step includes the step of designating an assigned memory section for reassignment based on the least recently active of the frames having frame address information corresponding to the assigned memory sections.

7. The method in accordance with claim 5 wherein the reassignment step includes the step of designating an assigned memory section for reassignment based on a sequential selection of the assigned memory sections.

8. The method in accordance with claim 5 wherein the reassignment step includes the step of cancelling the present frame address assignment of the memory section designated for reassignment.

9. The method in accordance with claim 5 wherein the reassignment step includes the step of resetting the contents of the memory section designated for reassignment prior to storage of the vocabulary of the current frame.

10. The method in accordance with claim 3 including the steps of:
    assigning an index code to the address information of each of a selected plurality of frames;
    mapping the frame address information of said current frame into its assigned index code.

11. The method in accordance with claim 10 including the steps of:
    assigning a memory slot of a routing table portion of said memory to each index code of said plurality; and
    storing in each memory slot an indication of memory section assignment corresponding to said index code.

12. The method in accordance with claim 11 including the steps of:
    positioning another table portion of said memory into areas for storing pointer information in connection with vocabulary memory section assignment and reassignment; and
    accessing said memory areas by the memory section indications stored in the memory slots of the routing table portion of memory.

13. A method for allocating memory for storage of vocabularies used in an adaptive data compression of a frame-multiplexed data stream of a data communication network in which at least one interconnecting node thereof is coupled to a plurality of communication links of said network, said method comprising the steps of:
    partitioning a memory of a data compression encoder of said interconnecting node into a portion for each communication link which may be coupled to said interconnecting node;
    partitioning each partitioned portion of said memory into a plurality of sections for the temporary storage of a corresponding plurality of data compression vocabularies;
    assigning a partitioned portion of said memory to a current frame of said frame-multiplexed data stream based on information of said current frame used by said encoder in connection with designating a communication link of said plurality over which said current frame is destined; and
    assigning a memory section of said assigned portion of said current frame based on said information of said current frame for storage of a vocabulary created adaptively from said current frame.

14. The method in accordance with claim 13 wherein the steps of assigning for storage of vocabularies are both performed dynamically.

15. The method in accordance with claim 13 including the steps of:
    including in each frame of the frame-multiplexed data stream address information;
    assigning a partitioned portion of said memory to said current frame based on said address information in said current frame of said frame-multiplexed data stream; and
    assigning a memory section of said assigned memory portion of said current frame based on said address information thereof.

16. The method in accordance with claim 15 wherein both assignments are based on frame information including a source/destination pair of addresses.

17. The method in accordance with claim 15 wherein the steps of assigning a memory section includes the steps of:
    assigning an unassigned memory section of the assigned memory portion to each current frame of the assigned memory portion having a frame address information different from that corresponding to the assigned memory sections thereof until all of the memory sections of the assigned memory portion are assigned; and thereafter reassigning a designated assigned memory section of the assigned memory portion for storage of a vocabulary for a current frame of the assigned memory portion having frame address information different from those corresponding to the assigned memory sections thereof.

18. The method in accordance with claim 17 wherein the reassignment step includes the step of designating an assigned memory section for reassignment based on the least recently active of the frames having frame address information corresponding to the assigned memory sections.

19. The method in accordance with claim 17 wherein the reassignment step includes the step of designating an assigned memory section for reassignment based on a sequential selection of the assigned memory sections.

20. The method in accordance with claim 17 wherein the reassignment step includes the step of cancelling the present frame address assignment of the memory section designated for reassignment.

21. The method in accordance with claim 17 wherein the reassignment step includes the step of resetting the contents of the memory section designated for reassignment prior to storage of the vocabulary of the current frame.

22. The method in accordance with claim 15 including the steps of:
assigning an index code to the frame address information of each of a selected plurality of frames;
mapping the frame address information of said current frame into its assigned index code.

23. The method in accordance with claim 22 including the steps of:
assigning a memory slot of a routing table portion of said memory to each index code of said plurality; and
storing in each memory slot an indication of memory portion and section assignment corresponding to said index code.

24. Apparatus for dynamically allocating memory of an encoder of a data communications network for storage of vocabularies used in an adaptive data compression of a frame-multiplexed data stream by said encoder, said apparatus comprising:
memory means partitioned into a plurality of sections for the temporary storage of a corresponding plurality of data compression vocabularies; and
means for assigning a memory section of said memory means based on information of a current frame (other than information from a user data-information field) of said frame-multiplexed data stream to store a vocabulary created adaptively from said current frame for the duration of the frame by said encoder.

25. The apparatus in accordance with claim 24 wherein the assigning means includes means for assigning a memory section dynamically.

26. The apparatus in accordance with claim 24 wherein each frame of the frame-multiplexed data stream includes address information and including:
means for assigning a memory section of the memory means to the current frame based on the address information in the current frame.

27. The apparatus in accordance with claim 26 wherein the frame address information includes a source/destination pair of addresses.

28. The apparatus in accordance with claim 26 wherein the assigning means includes:
means for assigning an unassigned memory section of the memory means to each current frame having frame address information different from that corresponding to the assigned memory sections until all of the memory sections are assigned; and
means for reassigning a designated assigned memory section of the memory means for storage of a vocabulary for a current frame having frame address information different from that corresponding to the assigned memory sections.

29. The apparatus in accordance with claim 28 wherein the reassigning means includes means for designating an assigned memory section for reassignment based on the least recently active of the frames having frame address information corresponding to the assigned memory sections.

30. The apparatus in accordance with claim 28 wherein the reassigning means includes means for designating an assigned memory section for reassignment based on a sequential selection of the assigned memory sections.

31. The apparatus in accordance with claim 28 wherein the reassigning means includes means for cancelling the present frame address assignment of the memory section designated for reassignment.

32. The apparatus in accordance with claim 28 wherein the reassigning means includes means for resetting the contents of the memory section designated for reassignment prior to storage of the vocabulary of the current frame.

33. The apparatus in accordance with claim 26 wherein the network includes at least one interconnecting node ported to a plurality of communication links, said interconnecting node including the data compression encoder; and means for designating a communication link of said plurality for the current frame based on the frame address information thereof; wherein the memory means is partitioned into a portion for each communication link which may be coupled to said interconnecting node and each memory portion is partitioned into the plurality of sections for the temporary storage of a corresponding plurality of data compression vocabularies; and wherein the assigning means included:
means for assigning a partitioned portion of the memory means to a current frame based on the frame address information thereof; and
means for assigning a memory section of said assigned memory portion of said current frame based on said frame address information thereof.

34. The apparatus in accordance with claim 33 including:
means for mapping the frame address information of the current frame into an index code uniquely assigned thereto;
a routing table portion of the memory means including a memory slot corresponding to each index code; and
means for storing in each memory slot on indication of memory portion and section assignment corresponding to said index code.

* * * * *